May 12, 1970 M. C. KILLION ET AL 3,512,100

AUDIO FREQUENCY AMPLIFICATION CIRCUIT

Filed July 3, 1968

Inventors
Mead Clifford Killion
Elmer Victor Carlson
Mahlon D. Burkhard
By: Stone, Zummer & Livingston attys.

3,512,100
Patented May 12, 1970

3,512,100

AUDIO FREQUENCY AMPLIFICATION CIRCUIT

Mead Clifford Killion, Elk Grove Village, Elmer Victor Carlson, Prospect Heights, and Mahlon Daniel Burkhard, Hinsdale, Ill., assignors to Industrial Research Products, Inc., Elk Grove Village, Ill., a corporation of Delaware Filed July 3, 1968, Ser. No. 742,239
Int. Cl. H03f *3/16*
U.S. Cl. 330—38 9 Claims

ABSTRACT OF THE DISCLOSURE

An audio frequency amplification circuit for use with a low voltage power source. The circuit includes a field-effect transistor which has a pinch-off voltage equal to or less than the voltage of the power source. The field-effect transistor has one electrode connected to one side of the power source and another electrode connected to one side of a load impedance element. The transistor also includes a gate electrode connected to one side of a signal source, and the other side of the signal source is connected to the other electrode of the transistor. A bias element is connected between the gate electrode and the other side of the load impedance element which is also connected to the other side of the power source. Means for receiving the amplified signal is connected across the load impedance element.

BACKGROUND OF THE INVENTION

The use of field-effect transistors for amplification in audio frequency circuits has been well accepted since they have a long life and a high degree of reliability, and they are generally readily available commercially.

In a junction field-effect transistor, a thin conductive section or channel is surrounded by a diode junction called the gate. A voltage applied between a diode terminal and a channel in the blocked or non-conductive direction of the transistor causes the diode interface to intrude into and constrict the channel and thus modify its resistance. With a voltage applied between the ends of the channel and when sufficient voltage exists between the gate and at least a portion of the channel to nearly eliminate that conductive portion of the channel, two voltage-current relationships are observed. First, when the voltage between the gate and one channel electrode, called the drain, exceeds a minimum value the current through the channel becomes almost independent of this voltage in that the current is substantially constant. The minimum gate to drain voltage to produce this action is called the pinch-off voltage. When the voltage between the gate and the other channel electrode, called the source, is changed, the magnitude of this aforementioned current is changed. If both ends of the channel have a voltage with respect to the gate so that the diode is nonconducting, the impedance between the gate and the channel is very high. When the transistor is operated in this condition, a signal source capable of producing voltage, but at very low current, can be made to modify a much larger current which, when passed through an output device of sufficient impedance, yields amplification. The usual circuit configuration for achieving this amplification is shown in FIG. 1.

Referring now to FIG. 1 which is a circuit diagram of a typical prior art circuit, a battery 10 is connected to a field-effect transistor 12 and the polarity 10 is determined by the polarity of the diode junction of the transistor. The circuit shown in FIG. 1 is for an N-channel device. A P-channel transistor would require reversal of the polarity of the circuit, and the current would flow in the opposite direction. A resistor 14 is conected to battery 10 to establish a desired level of current flow. A capacitor 16 is connected in parallel with resistor 14 to eliminate feedback or degeneration due to the amplified signal current flowing in the resistor 14. A microphone 18 has one side connected to a gate 20 of the transistor and the other side is connected to the negative side of battery 10. To achieve a useful operation condition, the potential between gate 20 and a drain 22 of transistor 12 must approximate or exceed the pinch-off voltage of the transistor. A third electrode of the transistor is source 24 which is connected to the resistor 14 A load impedance element 26 is connected to drain 22 and to the positive side of battery 10. A receiver 28, which receives the useful amplified signal, is connected across the impedance element 26, and a capacitor 30 is connected between the impedance element and the receiver to block the direct current. The impedance element 26 must be of a sufficient magnitude to absorb signal power from the modulation of the current passing through the circuit consisting of battery 10, which provides the voltage supply, the load impedance and a conduction path from drain 22 to source 24 of transistor 12. This means that the value of the supply voltage in battery 10 must exceed a minimum value of the pinch-off voltage of the field-effect transistor by the voltage drop across the impedance element 26. It may be appreciated that if the impedance element were an efficient transformer or inductor, the value of the supply voltage could approximate the value of the pinch-off voltage. In miniature devices, such as, amplifiers for hearing aids, transformers are not applicable because of their large size. It therefore follows that the impedance element 26 is ordinarily a resistor or resistors, another transistor, or a combination of the two. Thus, such circuits require that the supply voltage exceed substantially the pinch-off voltage. This is a practical limitation when working with a miniature amplifier because of the necessity to use a space saving single cell which can provide supply voltages in the range of 1.3 to 1.5 volts. To achieve useful amplification in this type of arrangement, there is a requirement that the pinch-off voltage be approximately 0.7 volt or less. This low value of acceptable pinch-off voltage makes suitable transistors expensive to obtain.

SUMMARY OF THE INVENTION

The present invention relates to an audio frequency amplification circuit for use in an application wherein the power source has a relatively low voltage. The present circuit is also particularly useful for amplification of a signal from a high impedance source. The instant circuit utilizes a field-effect transistor wherein the field-effect transistor has a pinch-off voltage which is equal to or less than the voltage of the power source. The present circuit provides a circuit construction wherein a reverse bias voltage applied to the gate of the field-effect transistor with respect to the drain of the field-effect transistor is substantially equal to the voltage of the power source.

A further object of the present invention is to provide an improved audio frequency amplification system which utilizes a pair of parallel but opposed diodes connected to the gate of a field-effect transistor to provide a bias means for the transistor.

It is another object of the herein-disclosed invention to provide an audio frequency amplification circuit wherein the amplification circuit provides a substantial gain with a very low voltage from the power source with a minimum of noise.

It is a further object of the herein-disclosed invention to provide a simple audio frequency amplification circuit wherein the amplified signal may be taken across a load impedance element and the noise level is held to a minimum.

Other objects and uses of the present invention will become readily apparent to those skilled in the art upon a perusal of the following specification in light of the accompanying drawings.

DESCRIPTION OF THE PREFERRED EMBODIMENT

Figure 1:
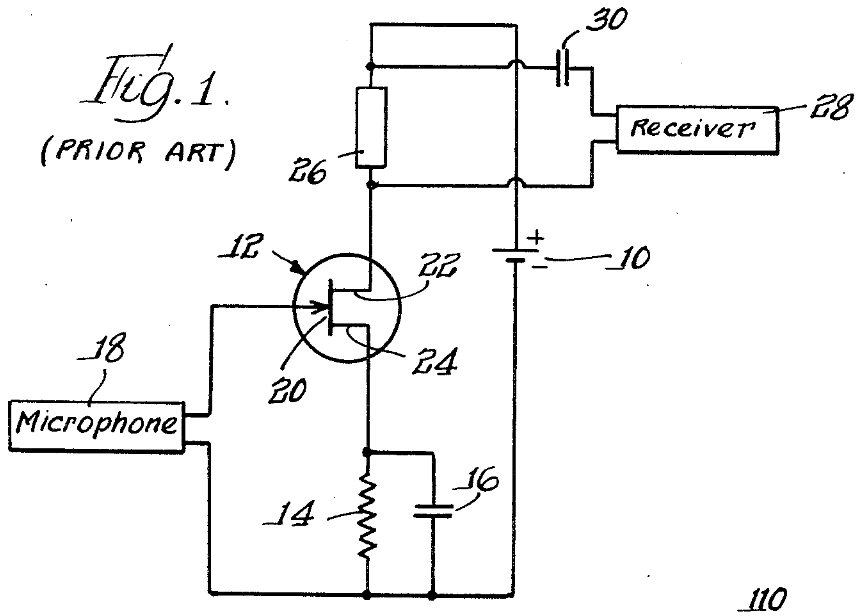
Fig. 1. (PRIOR ART)
FIG. 1 is a schematic of a prior art circuit.
Figures 2, 3:
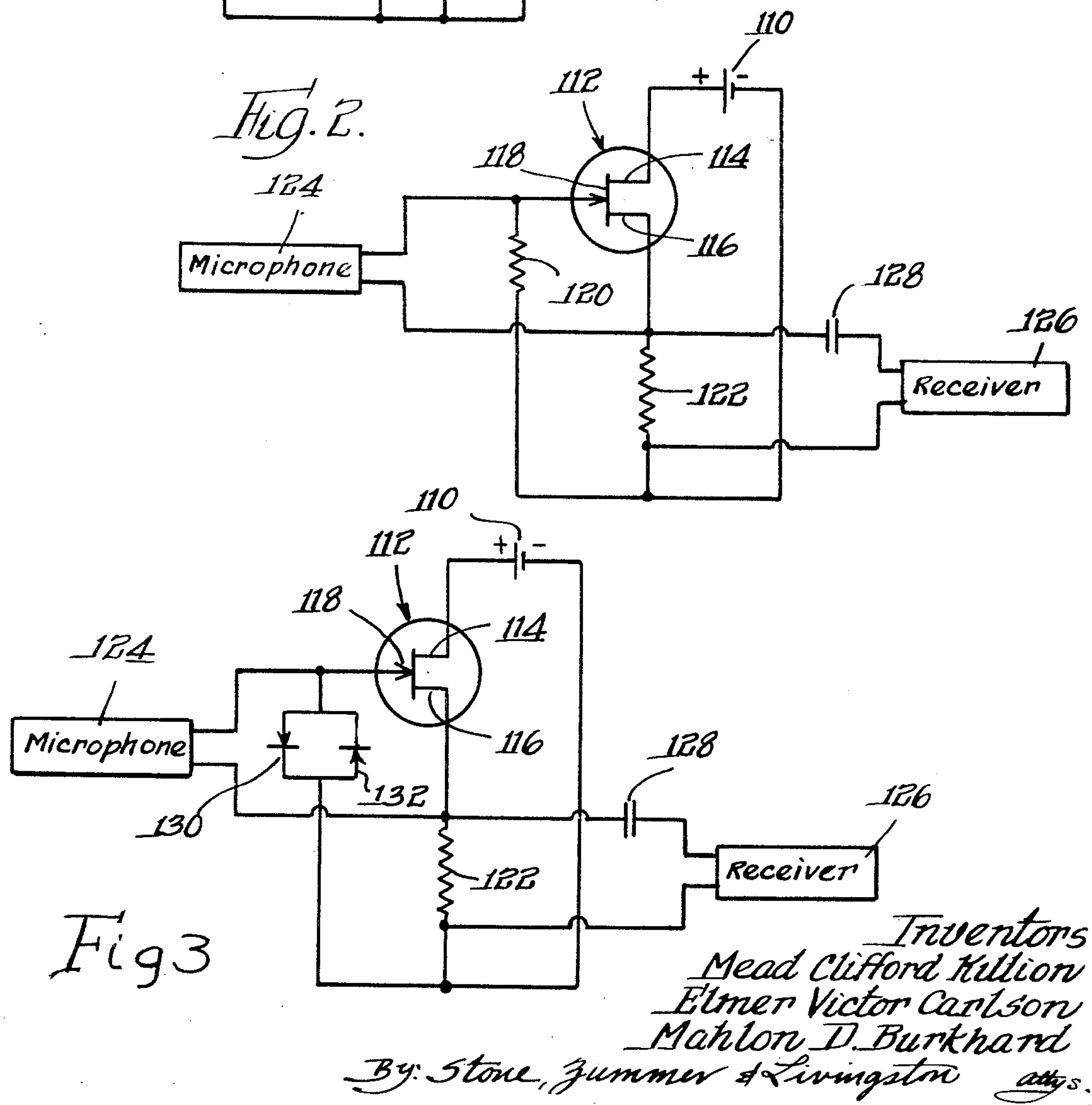
FIG. 2 is a schematic of a circuit embodying the herein-disclosed invention utilizing a field-effect transistor.
FIG. 3 is a schematic of a circuit embodying the present invention which is substantially identical to the circuit of FIG. 1, however, a pair of parallel opposed diodes replace a resistor to provide a bias means for the field-effect transistor.

Referring now to FIG. 2, a circuit which is a specific embodiment of the herein-disclosed invention may be seen therein. In this embodiment, the circuit is shown for a simplified version of a hearing aid. However, it may be readily appreciated that the instant circuit may be adapted for other uses, such as, to be used on a phonograph record pick-up.

A power source 110, in this instance, is a cell or battery having an initial voltage of 1.5 volts. The power source is connected to a field-effect transistor 112 which in this instance is an N-channel transistor. The transistor 112 includes a first electrode 114 which functions as the drain electrode and is connected to the positive side of power source 110. The transistor 112 includes a second electrode 116 which functions as a source electrode and a third electrode 118 which is a gate electrode. It may be readily appreciated that should the field-effect transistor 112 be a P-channel transistor, the first electrode (drain) would be connected to the negative side of the power source 110.

A reverse bias voltage with respect to the first electrode is applied to gate 118 through a bias impedance element 120 which in this instance is a resistor. The bias impedance element has one side connected to gate electrode 118 and the other side is connected to the negative side of power source 110. A load impedance element 122 has one side connected to the second electrode 116 and the other side is connected to the negative side of power source 110.

A signal source, which in this instance, is a high impedance piezoelectric microphone 124, has one side connected to the gate electrode 118 and the other side is connected to the second electrode 116. It may be appreciated that the microphone may be of a magnetic type, a dynamic type, an electrostatic type or other suitable type. In the event such a microphone provides as ready or approximately as ready a path for direct current, as for the signal current, a capacitor would be added to block substantially the direct path for direct current between the gate electrode 118 and the second or source electrode 116.

The amplified signal appears in a load, which consists of the load impedance element 122 and an earphone receiver 126. A capacitor 128 connected between element 122 and the receiver blocks the passage of the direct current through the receiver. If it is desired to achieve more amplification, the receiver may be replaced by a combination of additional stages of amplification and the receiver.

It should also be noted that the instant circuit is such that the gate-drain voltage is substantially equal to the voltage of the power source so that the pinch-off voltage for the field-effect transistor 112 which will yield acceptable operation conditions may be substantially equal to or less than the voltage of the power source. In actual practice, it is desirable to have the pinch-off voltage at least slightly less than the voltage of the power source since the power source is a cell and the voltage tends to decay during its life. That is, it is desirable to provide for a certain amount of voltage decay to occur before the voltage of the power source becomes less than the pinch-off voltage of the field-effect transistor, which thereby decreases the effective gain of the circuit.

Referring now to FIG. 3, which is a modification of the audio frequency amplication circuit shown in FIG. 2 and described in detail above, a pair of diodes 130 and 132 replace the bias impedance element 120 and provide the bias means for the field-effect transistor. All of the remainder of the parts are identical to the circuit shown in FIG. 2 and are identically numbered. It should be noted that the diodes 130 and 132 are connected in parallel and in opposite directions. In the event that there should be any leakage of current from the gate or through insulation for the field-effect transistor, the current will pass through diode 130. When the leakage current is very small, the apparent resistance is very high and a good quiet operation of the circuit is attained. However, if there is degradation of the transistor 112 or insulation for the transistor and the current were to increase, the resistance of the diode would also decrease, as is well known with diodes, so that the current is passed without a substantial increase in voltage drop which would subtract from the available gate to drain voltage. It therefore follows that as the transistor and insulation degrade due to aging and other factors, the performance of the circuit tends to degrade because of increased noise in the circuit, but there is no loss in amplification by the circuit. In instances where the circuit is used in a hearing aid, the user of the hearing aid notes a progressive increase in noise which would cause the user to have the hearing aid repaired at a convenient time. Otherwise, a situation may occur wherein the circuit would fail completely, and the wearer would be forced to make repairs at an inconvenient time and may have a complete loss of the hearing aid at a critical time.

The diode 132 provides the function of maintaining the operation of a circuit when there is a temporary overload of the circuit. In the event that a loud sound or mechanical shock causes microphone 124 to deliver a substantial positive voltage to the diode 130 and to the gate 118, this will cause a charge to pass as diode 130 will become biased in the forward direction. Upon removal of the stimulus, the the capacitance of microphone 124 will have a more negative potential to gate 118 than the negative terminal of the power source 110. The diode 130 would now be reverse biased. If the disturbing signal were strong enough, the voltage between the gate 118 and the source 116 can be sufficiently great so that the current through the transistor 112 is diminished to the point where it fails to amplify or to pass on satisfactorily the microphone signals. Because there is an extremely low leakage through reverse biased diodes, an appreciable time may be required for this charge to leak away and the amplification to be reestablished. Experience has demonstrated that the duration of non-amplification may range from ten seconds to several minutes before satisfactory operation is resumed. The diode 132 provides a ready path for the interfering charge to be dissipated. The diode 132 dissipates the charge in a very short time so that there is no noticeable interference with the ordinary understanding of speech. The remainder of the operation of the circuit is identical to that as described and disclosed in detail in connection with the circuit shown n FIG. 2.

What is claimed is:

1. An audio frequency amplification circuit for use with a low voltage power source comprising, in combination, a field-effect transistor having one electrode connected to one side of the power source, a second electrode of said transistor connected to one side of a bias means, the other side of the bais means connected to the other side of the power source, a signal source having one side connected to the second electrode, a load impedance element having one side connected to a third electrode of the transistor and the other side of the signal source, the other side of the load impedance element connected to the other side of the power source and to the other side of the bias means, and means for receiving the signal generated across the load impedance element.

2. An audio frequency amplification circuit as defined in claim 1, wherein the field-effect transistor has a pinch-off voltage equal to or less than the voltage of the power source.

3. An audio frequency amplification circuit as defined in claim 1, wherein the bias means is a bias impedance element having one side connected to the second electrode and the other side connected to the other side of the power source.

4. An audio frequency amplification circuit as defined in claim 1, wherein the bias means is a diode.

5. An audio frequency amplification circuit as defined in claim 1, wherein the bias means is a diode having one side connected to the second electrode and the other side connected to the other side of the power source, and the field-effect transistor has a pinch-off voltage equal to or less than the voltage of the power source.

6. An audio frequency amplification circuit as defined in claim 1 wherein the bias means is a bias impedance element having one side connected to the second electrode and the other side connected to the other side of the power source and the field-effect transistor has a pinch-off voltage equal to or less than the voltage of the power source.

7. An audio frequency amplification circuit as defined in claim 1, wherein the bias means includes a pair of diodes connected in parallel and each of said diodes being adapted to pass current in opposite directions.

8. An audio frequency amplification circuit as defined in claim 1, wherein the field-effect transistor is an N-channel field-effect transistor and the one electrode is a drain electrode connected to the positive side of the power source.

9. An audio frequency amplification circuit as defined in claim 1 wherein the field-effect transistor is an N-channel field-effect transistor and the one electrode is a drain electrode connected to the positive side of the power source and the bias means is a bias impedance element having one side connected to the second electrode and the other side of the bias impedance element is connected to the negative side of the power source.

References Cited

UNITED STATES PATENTS

| | | | |
|---|---|---|---|
| 2,517,863 | 8/1950 | Froman | 330—87 X |
| 2,927,275 | 3/1960 | Herrmann et al. | 330—17 |
| 3,286,189 | 11/1966 | Mitchell et al. | 330—18 |

ROY LAKE, Primary Examiner

J. B. MULLINS, Assistant Examiner

U.S. Cl. X.R.

330—32, 40

PO-1050
(5/69)

UNITED STATES PATENT OFFICE
CERTIFICATE OF CORRECTION

Patent No. 3,512,100 Dated May 12, 1970

Inventor(s) M. C. KILLION ET AL

It is certified that error appears in the above-identified patent and that said Letters Patent are hereby corrected as shown below:

Column 1, line 67, after "polarity" insert

--of battery--.

SIGNED AND
SEALED
SEP 15 1970

(SEAL)
Attest:

Edward M. Fletcher, Jr.
Attesting Officer

WILLIAM E. SCHUYLER, JR.
Commissioner of Patents